United States Patent
Nakamura

(10) Patent No.: US 7,307,555 B2
(45) Date of Patent: Dec. 11, 2007

(54) INFORMATION RECORDING PROCESSING APPARATUS, INFORMATION RECORDING PROCESSING METHOD AND COMPUTER PROGRAM

(75) Inventor: Kosuke Nakamura, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/490,694

(22) Filed: Jul. 21, 2006

(65) Prior Publication Data

US 2007/0024478 A1 Feb. 1, 2007

(30) Foreign Application Priority Data

Jul. 21, 2005 (JP) ............................ P2005-210833

(51) Int. Cl.
*H03M 5/00* (2006.01)
(52) U.S. Cl. .......................................... 341/58; 341/59
(58) Field of Classification Search ................. 341/58, 341/59, 50, 67, 65
See application file for complete search history.

(56) References Cited

U.S. PATENT DOCUMENTS

| 5,506,581 A * | 4/1996 | Ino et al. ....................... 341/58 |
| 6,853,319 B1* | 2/2005 | Ren ............................. 341/58 |
| 6,982,660 B2* | 1/2006 | Nakagawa et al. ........... 341/58 |
| 2004/0130467 A1* | 7/2004 | Nakagawa et al. ........... 341/58 |

* cited by examiner

*Primary Examiner*—Peguy JeanPierre
(74) *Attorney, Agent, or Firm*—Lerner, David, Littenberg, Krumholz & Mentlik, LLP

(57) ABSTRACT

An information recording processing apparatus includes a modulating portion operable to modulate write data on an information recording medium and to create code data thereby; and a DC level calculating portion operable to calculate a DC level corresponding to a given run length based on a coefficient defined in accordance with the run length of a component bit of the code data, wherein DC-controlled code data is created or selected based on a DC level addition result based on the DC level corresponding to the given run length, and the created or selected data is defined as write data onto the information recording medium.

13 Claims, 10 Drawing Sheets

FIG. 2

| INPUT DATA BITS | MODULATED DATA BITS |
|---|---|
| 00000000 | 010100100100 |
| 00001000 | 000100100100 |
| 000000 | 010100000 |
| 000001 | 010100100 |
| 000010 | 000100000 |
| 000011 | 000100100 |
| 0001 | 000100 |
| 0010 | 010000 |
| 0011 | 010100 |
| 01 | 010 |
| 10 | 001 |
| 11 | 000　PRECEDING MODULATED BITS = xx1<br>101　PRECEDING MODULATED BITS = xx0 |

FIG. 5A

RUN-LENGTH-CORRESPONDING COEFFICIENT TABLE

| RUN LENGTHS | COEFFICIENTS |
|---|---|
| 2 | 3.0 |
| 3 | 4.0 |
| 4 | 5.0 |
| 5 ~ | 6.0 |

FIG. 5B

INPUT CODE DATA EXAMPLE

INPUT DATA  0 1 0 0 1 0 0 0 1 0 0 0 0 1 0 0

RUN LENGTH = 2, RUN LENGTH = 3, RUN LENGTH = 4

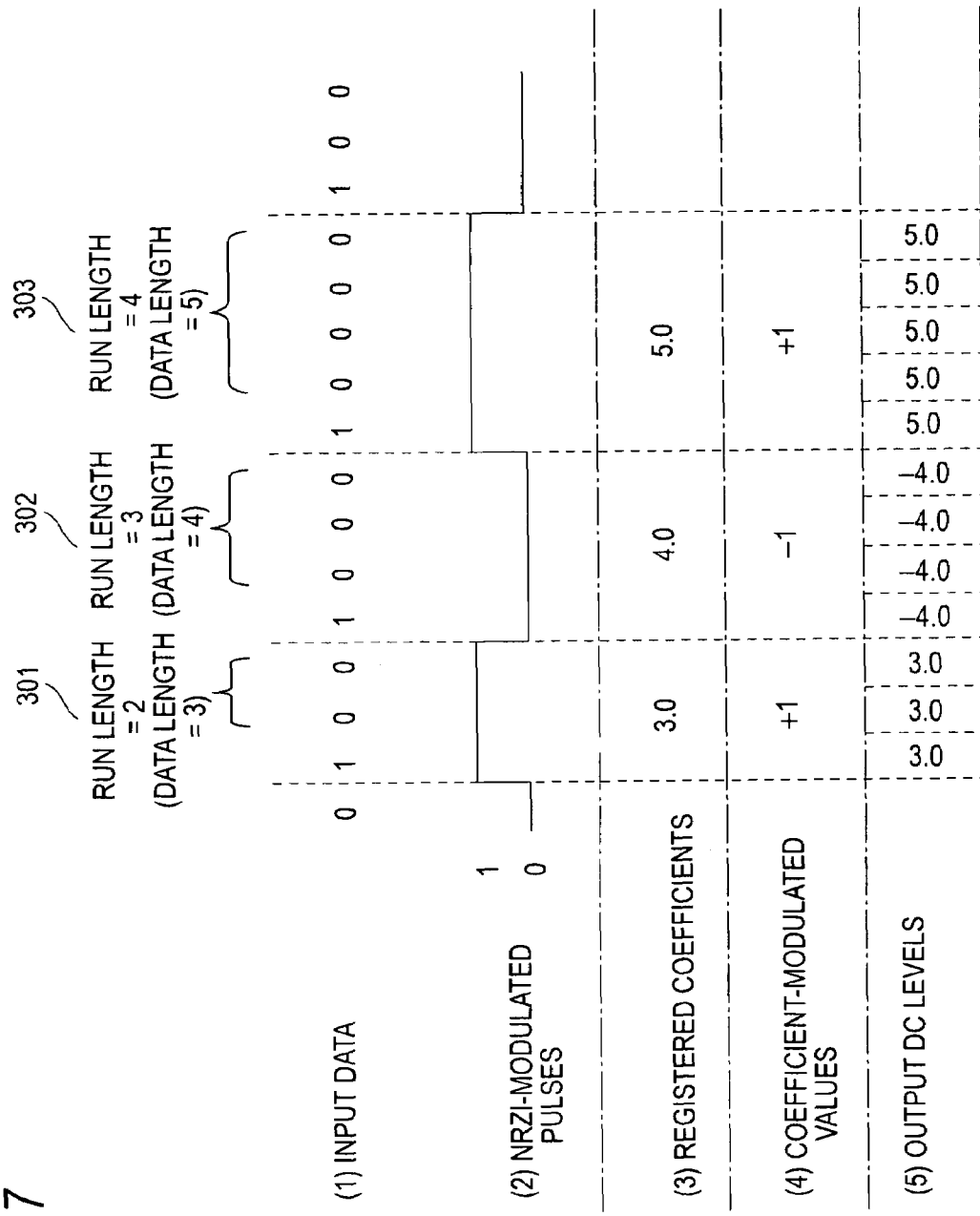

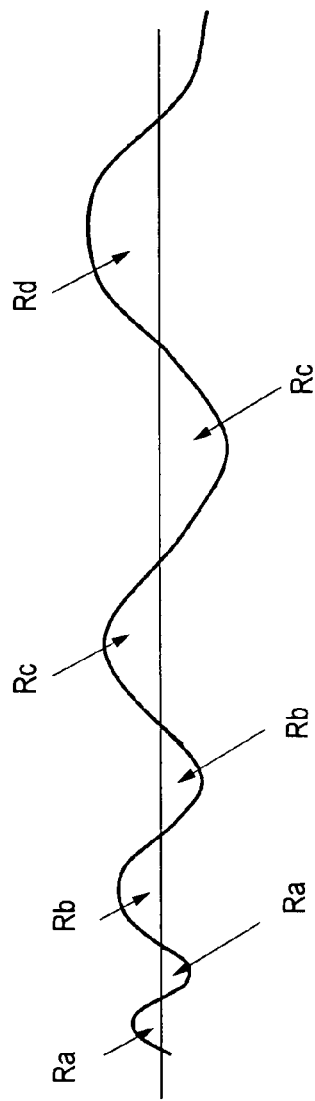

INFORMATION RECORDING PROCESSING APPARATUS, INFORMATION RECORDING PROCESSING METHOD AND COMPUTER PROGRAM

CROSS-REFERENCE TO RELATED APPLICATIONS

The present application claims priority from Japanese Patent Application No. JP2005-210833 filed on Jul. 21, 2005, the disclosure of which is hereby incorporated by reference herein.

BACKGROUND OF THE INVENTION

1. Field of the Invention

The present invention relates to an information recording processing apparatus, an information recording processing method and a computer program. In particular, the invention relates to an information recording processing apparatus, information recording processing method and computer program for performing data recording processing on an information recording medium such as an optical disk.

2. Description of the Related Art

Recording processing in accordance with a predetermined recording format is performed in recording data such as music data and image data as digital data on a recording medium. For example, an error detection/correction code is added to the original data to be recorded, which is then converted (encoded) to and recorded in a format in accordance with specific data writing/reading processing.

For example, in recording a signal on an optical disk, in addition to contents data such as a movie and a tune, format data is created with a signal required for generating a servo signal and/or reference clock signal available in data reading. Then, modulation processing in accordance with each data writing/reading method is performed thereon before the recording processing.

Typical examples of such modulation methods include EFM method used for a Compact Disc (CD) and a "Mini-Disc (Registered Trademark of Sony Corporation)", 8-16 modulation method used for a digital versatile disk (DVD), (1,7) RLL modulation method used for a magneto-optical disk, and 17PP modulation method used for a Blu-ray disk (BD).

For example, in (1,7) RLL modulation method, modulation is performed based on processing of modulating 2-bit data to 3-bit data. (1,7) RLL modulation method adopts a data conversion method which handles modulated data in accordance with the run length limit of RLL (1,7) in which the number of successive [0] in the modulated bit is one at the minimum and seven at the maximum. Notably, a conversion table is used in this conversion processing. A recording unit called recording frame with a synchronizing signal defined is created based on the modulation data and is recorded on an information recording medium such as an optical disk through a write signal processing circuit.

In the various kinds of modulation processing as described above, DC control is performed for data recording. For example, a DC-control bit is inserted at predetermined intervals in data such that the absolute value of a digital sum value (DSV) subject to modulation can be small before processing of creating write data is performed thereon.

The DC control processing is performed for control for keeping the low-frequency component of a Non Return to Zero Inverted (NRZI) signal as small as possible. In this case, the NRZI signal is a write signal onto a final disk. When a low-frequency component is included in a modulation signal, the low-frequency component leaks to a servo signal of an optical pickup in reading, resulting in an adverse effect on the servo. In order to prevent this, the DC control bit is inserted to keep the low-frequency component of the NRZI signal as small as possible. Notably, the NRZI (Non Return to Zero Inverted) signal is generated by inverting the sign of a pulse in accordance with [0] or [1] of modulated data.

A digital sum value (DSV) is an indicator for a DC balance of an NRZI-modulated signal, which is a write signal to an information recording medium. More specifically, the value including an accumulation of "−1" and "+1" where the bit [0] is handled as "−1" and bit [1] is handled as "+1" in a write bit stream (NRZI-converted signal). Then, for example, in order to reduce the alienation of the DSV from zero, "0" or "1" of the DC control bit is selectively inserted thereto.

In other words, the DSV is a value resulting from sequential additions of symbols from the starting point in a wave train where the symbols 1 and 0 corresponding to bit values are handled as +1 point and −1 point, respectively, in a recording wave train. The DSV is used as a criterion for evaluation of a direct-current component of a modulated signal. When the absolute value of a DSV is small, the direct-current component or low-frequency component is small. Therefore, the value of the DC control bit to be inserted for keeping the absolute value of the DSV small is determined. The descriptions on a general DC control bit and a DSV are disclosed in "Hikari Disk (Optical Disk)," Rajio Gijutsu Sha, Pg. 180.

On the other hand, in data reading from an optical disk, when the size of the pit formed on a disk is small in comparison with the magnitude of a light beam, a change of reflected light is small, resulting in a small amplitude of the read signal. In other words, a small pit length and/or pit interval on a disk (which raises a spatial frequency) tends to cause a small read amplitude. A change in amplitude for a spatial frequency is called Modulation Transfer Function (MTF). In this way, it is known that a read waveform has a property of having an amplitude of a read signal attenuating in a high frequency due to the optical characteristic (MTF). The general description on reading processing on an optical disk is disclosed in, for example, "DVD Dbkuhon (DVD reader)," Ohmsha, Pg. 98.

As described above, for control for keeping the low-frequency component of an NRZI (non Return to Zero Inverted) signal, which is a write signal, as small as possible in data recording processing, a DSV is a sum of symbols from a starting point in a wave train where symbols 1 and 0 corresponding to bit values of a write bit stream (NRZI-converted signal) are +1 and −1 points, respectively. Then, the value of the DC control bit is selectively inserted such that the alienation of the DSV value from zero can be smaller.

However, DSV control in the past is only based on the number of data with symbols "1" and "0" independently of the height of the frequency of a signal to be recorded. In this case, when, for example, write data at a high frequency goes on for the symbol, "1", and write data at a low frequency goes on for the symbol, "0", the control processing controls the absolute value of the DSV closely to zero (0). However, in data reading, the average amplitude of a read signal of the data part corresponding to symbol, "1" is smaller than the average amplitude of a read signal of the data part corresponding to the symbol, "0". As a result, the read signal carries a low-frequency component biased to the side of symbol, "0", and proper control over a low-frequency component may not be performed, which is a problem.

Accordingly, it is desirable to propose an information recording processing apparatus, information recording processing method and computer program, which can implement proper control over a low-frequency component even when the height of the frequencies of write data corresponding to symbols "1" and "0" is out of balance.

SUMMARY OF THE INVENTION

According to an aspect of the present invention, there is provided an information recording processing apparatus including a modulating portion operable to modulate write data on an information recording medium and to create code data thereby; and a DC level calculating portion operable to calculate a DC level corresponding to a given run length based on a coefficient defined in accordance with the run length of a component bit of the code data, wherein DC-controlled code data is created or selected based on a DC level addition result based on the DC level corresponding to the given run length, and the created or selected data is defined as write data onto the information recording medium.

The information recording processing apparatus according to an embodiment of the invention may further include a DC control bit inserting portion operable to define a DC control bit by applying a digital sum value (DSV) based on the DC level addition result; and an NRZI converting portion operable to perform an NRZI conversion process on data after the DC control bit is inserted thereto by the DC control bit inserting portion.

In the information recording processing apparatus according to an embodiment of the invention, the modulating portion selects multiple code data candidates through write data modulation processing, the DC level calculating portion performs the process of calculating the DC level corresponding to the run length based on the coefficient defined in accordance with the run length of a component bit of each code data candidate of the multiple code data candidates, and the modulating portion performs a final code data determination process by applying a digital sum value (DSV) based on the DC level addition result based on the DC levels corresponding to the multiple run lengths for each of the code data candidates.

In the information recording processing apparatus according to an embodiment of the invention, the coefficient defined in accordance with the run length of a component bit of code data to be applied by the DC level calculating portion may be a coefficient reflecting the ratio of the areas of the regions defined by read signals corresponding to a bit stream and the line at DC level=0.

In the information recording processing apparatus according to an embodiment of the invention, the DC level calculating portion performs a process of calculating, as the DC level corresponding to each run length bit, the result of the multiplication of the coefficient corresponding to the run length in consideration of the DC level contribution corresponding to the waveform of a read signal from an information recording medium by the coefficient multiplication value determined by the NRZI-converted value of each run-length-corresponding bit.

In the information recording processing apparatus according to an embodiment of the invention, the DC level calculating portion determines the coefficient multiplication value as 1 when the NRZI-converted value of each run-length-corresponding bit is 1; and −1 when the NRZI-converted value of each run-length-corresponding bit is 0.

According to another aspect of the invention, there is provided an information recording processing method including modulating write data on an information recording medium and creating code data thereby; calculating a DC level corresponding to a given run length based on a coefficient defined in accordance with the run length of a component bit of the code data; and creating or selecting DC-controlled code data based on a DC level addition result based on the DC level corresponding to the given run length and defining the created or selected data as write data onto the information recording medium.

The information recording processing method according to an embodiment of the invention may further include performing a process to define a DC control bit by applying a digital sum value (DSV) based on the DC level addition result; and performing an NRZI conversion process on data after the DC control bit is inserted thereto.

In the information recording processing method according to an embodiment of the invention, the modulating step includes selecting multiple code data candidates through write data modulation processing; and the DC level calculating step includes performing the process of calculating the DC level corresponding to the run length based on the coefficient defined in accordance with the run length of a component bit of each code data candidate of the multiple code data candidates; and the method further includes performing a final code data determination process by applying a digital sum value (DSV) based on the DC level addition result based on the DC levels corresponding to the multiple run lengths for each of the code data candidates.

In the information recording processing method according to an embodiment of the invention, the coefficient defined in accordance with the run length of a component bit of code data to be applied by the DC level calculating step may be a coefficient reflecting the ratio of the areas of the regions defined by read signals corresponding to a bit stream and the line at DC level=0.

In the information recording processing method according to an embodiment of the invention, the DC level calculating step includes calculating, as the DC level corresponding to each run length bit, the result of the multiplication of the coefficient corresponding to the run length in consideration of the DC level contribution corresponding to the waveform of a read signal from an information recording medium by the coefficient multiplication value determined by the NRZI-converted value of each run-length-corresponding bit.

In the information recording processing method according to an embodiment of the invention, the DC level calculating step includes determining the coefficient multiplication value as 1 when the NRZI-converted value of each run-length-corresponding bit is 1; and −1 when the NRZI-converted value of each run-length-corresponding bit is 0.

According to another aspect of the invention, there is provided a computer program for causing an information recording processing apparatus to perform a process of creating write data, the program including modulating write data on an information recording medium and creating code data thereby; calculating a DC level corresponding to a given run length based on a coefficient defined in accordance with the run length of a component bit of the code data; and creating or selecting DC-controlled code data based on a DC level addition result based on the DC level corresponding to the given run length, and defining the created or selected data as write data onto the information recording medium.

It should be noted that the computer program according to an embodiment of the invention is available to a general computer system in which various program codes are executable, for example, through a computer-readable storage medium such as a CD, an FD and an MO and a communication medium such as a network. Providing the program in a computer-readable manner can implement processing in accordance with the program on the computer system.

Further objects, features and advantages of the invention will be apparent from further descriptions based on embodiments of the invention, which will be described later, and the attached drawings. It should be noted that the term "system" herein refers to a logical set construction of multiple apparatus, and is not limited to component apparatus within one cabinet.

In the construction according to an embodiment of the invention, when DC level control is performed based on the DSV of modulated data created based on write data on a recording medium, the process of calculating the DC level is performed by applying a coefficient in consideration of the DC level contribution corresponding to the waveform of a read signal. The construction allows the precise DC level control corresponding to a real read signal, which increases the effect of reducing the low-frequency component. Thus, the influence on the instability of the servo due to the increase in the low-frequency component of a read signal can be reduced, for example. Therefore, the power consumption can be reduced and a good read signal can be obtained without requiring the reinforcement of control for maintaining the stability of the servo.

BRIEF DESCRIPTION OF THE DRAWINGS

FIG. 2 is a diagram describing an example of modulation processing to be performed by the digital modulation processing unit;

FIGS. 5A and 5B are diagrams describing a construction example of a run-length-corresponding coefficient table;

FIG. 7 is a diagram describing processing of the DC level calculating portion of the information recording processing apparatus according to the embodiment of the invention;

FIGS. 8A to 8C are diagrams describing coefficients defined in the run-length-corresponding coefficient table;

DETAILED DESCRIPTION

Details of an information recording processing apparatus and information recording processing method according to embodiments of the invention will be described below with reference to drawings.

Figure 1:
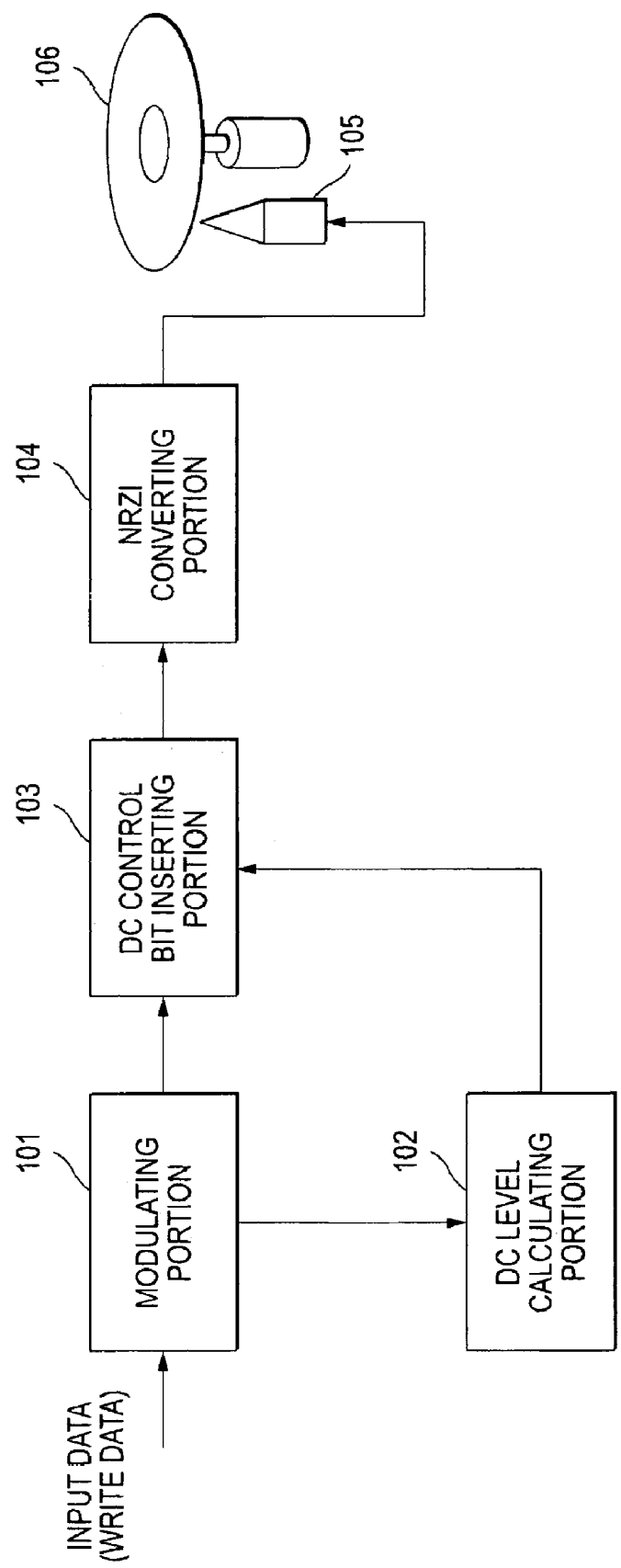
FIG. 1 is a diagram showing an example construction of a digital modulation processing unit of an information recording processing apparatus according to an embodiment of the invention.

FIG. 1 is a diagram showing a construction example of a digital modulation processing unit of an information recording processing apparatus according to an embodiment of the invention. FIG. 1 shows a construction example of a digital modulation processing unit for performing modulation processing in which a DC control bit is inserted at predetermined DC control intervals in a modulated code data stream as in (1,7) RLL, for example.

The processing by component portions of the digital modulation processing unit shown in FIG. 1 will be described. A modulating portion 101 shown in FIG. 1 performs processing of modulating 2-bit data to 3-bit data in accordance with (1,7) RLL modulation. (1,7) RLL modulation is a data conversion method for creating modulated data in accordance with the run length limit of RLL (1,7) in which the number of successive [0] in modulated bits is in the range between one at the minimum and seven at the maximum. Notably, this conversion processing applies a conversion table. A specific example of the conversion table is shown in FIG. 2.

As shown in FIG. 2, a conversion table includes correspondences between input bits and modulated data bits. For example, when input data is [00000000], the modulated data bit is [010100100100]. Input data [11] results in [000] if the preceding modulated data bits are [xx1] and [101] if the preceding modulated data bits are [xx0].

By executing the data conversion from 2 bit data to 3 bit data in accordance with the table, code data is created as modulated data under RLL (1,7) run length restriction rule.

The code data modulated in the modulating portion 101 is output to a DC level calculating portion 102 and a DC control bit inserting portion 103. The DC level calculating portion 102 identifies the run length of the code data created in the modulating portion 101, adds up the DC level values resulting from the multiplication of created values based on coefficients predefined based on run lengths, and outputs the result of the addition to the DC control bit inserting portion 103. Details of the processing in the DC level calculating portion 102 will be described later.

The DC control bit inserting portion 103 refers to the DC level sum value input by the DC level calculating portion 102 for data at predetermined DC control bit insertion intervals, determines the value of the DC control bit to be inserted such that the absolute value of the total of the DC level sum values from the start of the modulation can be closer to zero, and inserts a proper DC control bit having the determined value to the code data stream input by the modulating portion 101 at DC control bit insertion data intervals. The DC control code data stream including the DC control bit is output to an NRZI converting portion 104.

The NRZI converting portion 104 converts the input DC control code data stream input from the DC control bit inserting portion 103 to an NRZI signal and outputs the result as a write data stream. The output signal is recorded on a disk 106 through a pickup 105.

The NRZI converting portion 104 creates an NRZI (Non Return to Zero Inverted) signal resulting from the processing in which the sign of a pulse is inverted in accordance with the value [0] or [1] of modulated data and records it on an information recording medium 106 as a write signal.

Figure 3:
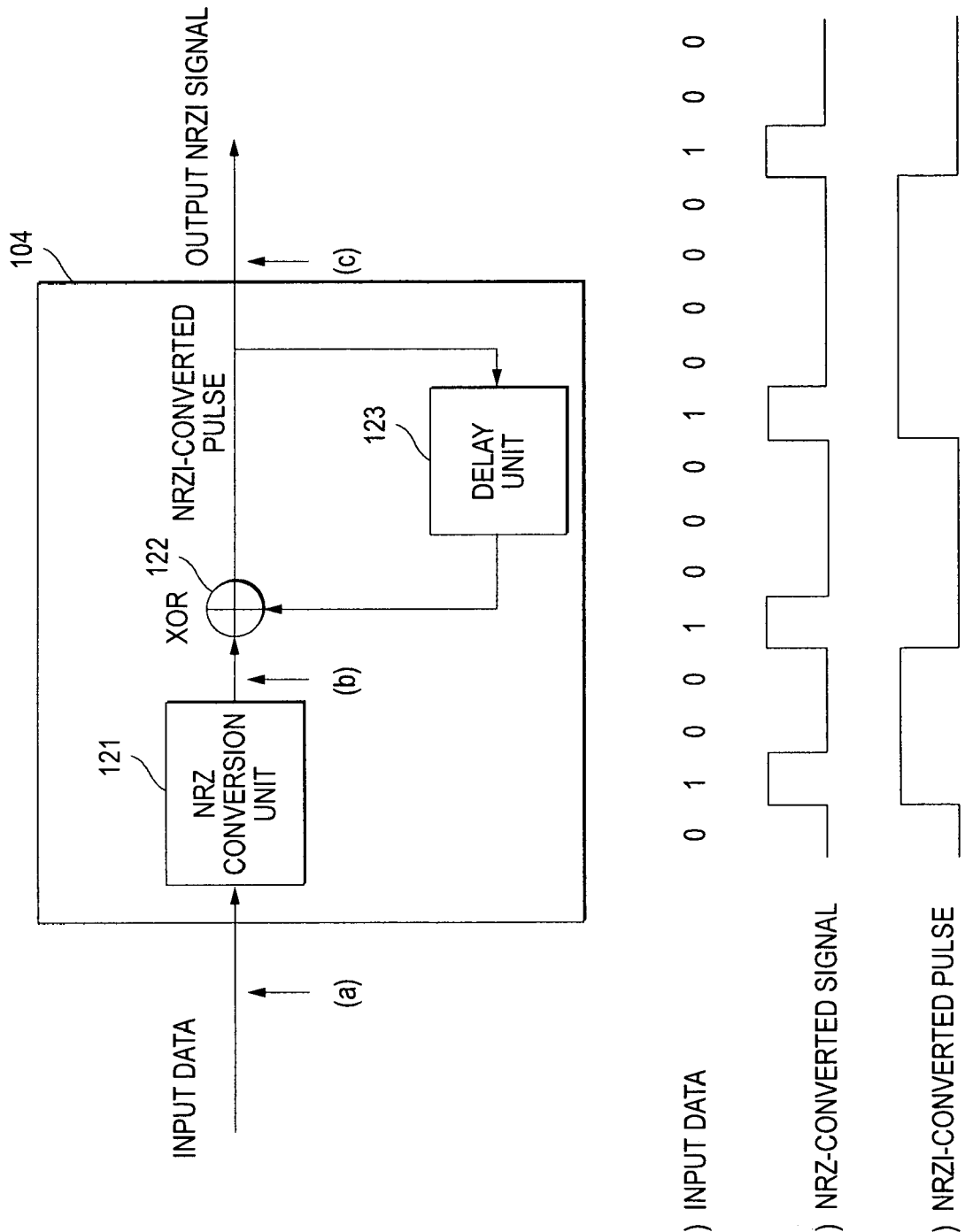
FIG. 3 is a diagram describing details of NRZI modulation processing.

FIG. 3 shows a construction for processing of creating NRZI, which is a write signal, to be performed by the NRZI converting portion 104. The NRZI converting portion 104 includes an NRZ converting unit 121, an exclusive OR unit (XOR) 122 and a delay unit 123. A channel bit, which is modulated data, is input to the NRZI converting portion 104, which then creates and outputs an NRZI-converted pulse functioning as a write signal through signal processing in the NRZ conversion unit 121, the XOR 122 and the delay unit 123.

In FIG. 3, (a), (b) and (c) are input data functioning as an input signal, output signals from the NRZ converting unit 121 and an NRZI-converted pulse functioning as a write signal, which is the final output, respectively. The NRZI-converted pulse is output to the pickup 105 as a write signal and is recorded on the information recording medium 106 under the control of a servo circuit. Input data, which is input signals shown in (a) in FIG. 3, is a DC control code data stream on which modulation processing is performed and to which a DC control bit is inserted.

Next, referring to FIG. 4, details of the construction and processing of the DC level calculating portion 102 will be described. As described above with reference to FIG. 1, the DC level calculating portion 102 performs processing of identifying the run lengths of code data created in the modulating portion 101, adding up DC level values resulting from the multiplication of coefficients corresponding to the run lengths, and outputting the addition result to the DC control bit inserting portion 103.

Figure 4:
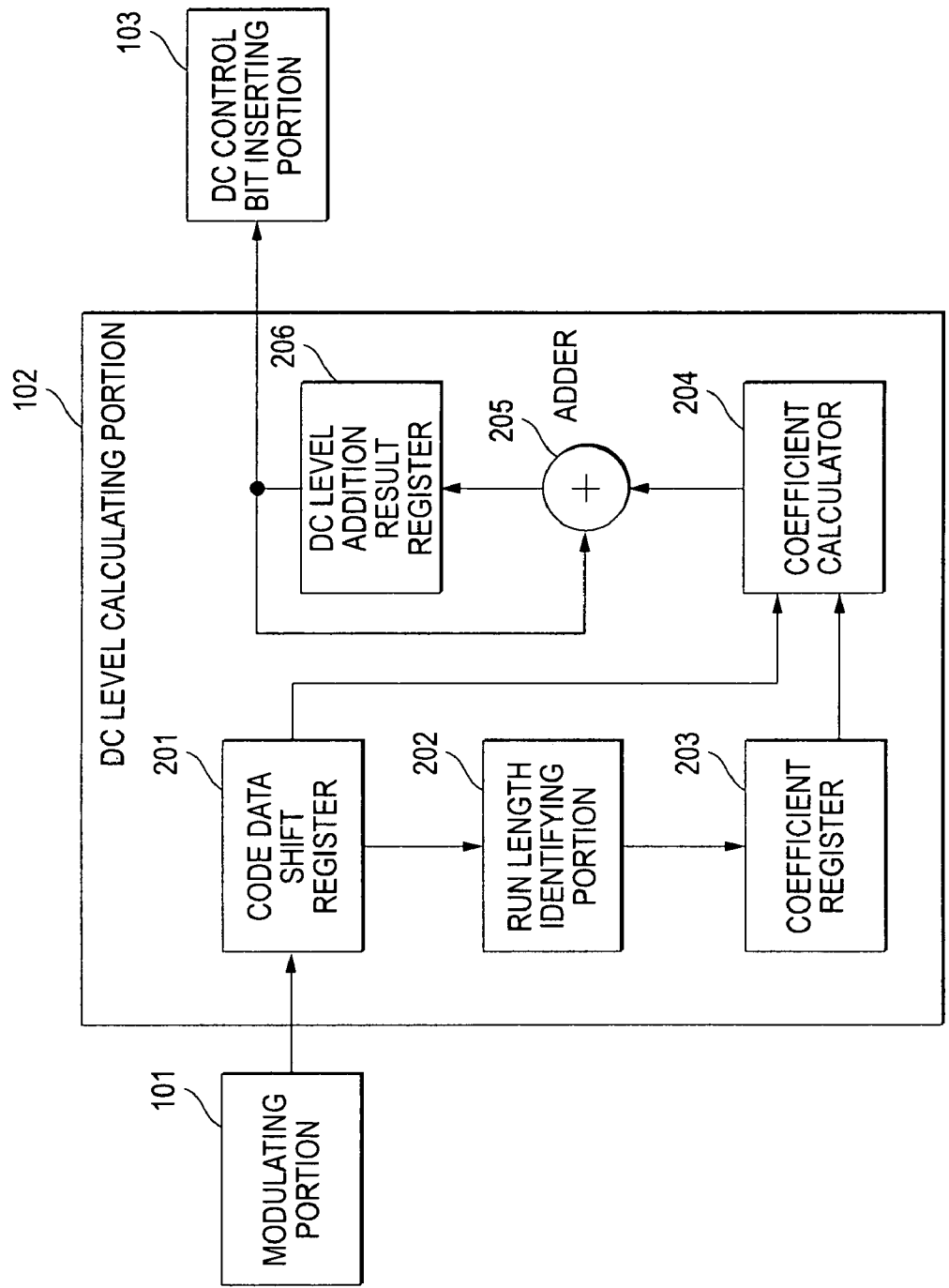
FIG. 4 is a diagram describing a construction and processing of a DC level calculating portion of the information recording processing apparatus according to the embodiment of the invention.

The DC level calculating portion 102 includes, as shown in FIG. 4, a code data shift register 201, a run length identifying portion 202, a coefficient register 203, a coefficient calculator 204, an adder 205 and a DC-level addition result register 206.

The encoded data as modulated data created in the modulating portion 101 is input to the code data shift register 201. The code data input to the code data shift register 201 is output to the run length identifying portion 202. After the code data shift register 201 outputs the code data to the run length identifying portion 202, the run length identifying portion 202 identifies the run length of the code data. The code data shift register 201 holds the code data input thereto until the processing of determining a coefficient corresponding to a given run length, which will be described later, is completed.

When the run length identifying processing corresponding to component data of the code data is completed in the run length identifying portion 202 and the coefficient value corresponding to the identified run length is output from the coefficient register 203 to the coefficient calculator 204, the code data shift register 201 outputs the code data corresponding to the output coefficient to the coefficient calculator 204.

The run length identifying portion 202 performs analysis on the code data input from the code data shift register 201 and identifies the length (run length) of the bit value, zero (0), included in the code data. The run length identifying portion 202 outputs the identified run length information of each code bit to the coefficient register 203 for each bit.

The coefficient register 203 has a register for storing a system-compliant coefficient, which may be calculated from the form of a signal waveform and/or signal amplitude in reading. Based on the run length information input from the run length identifying portion 202, the coefficient register 203 outputs to the coefficient calculator 204 the coefficients stored in the register, which correspond to run lengths.

The coefficients stored in the coefficient register 203 correspond to run lengths of bit streams included in code data. In a DVD system, for example, coefficients are determined based on a run-length-corresponding coefficient table storing coefficients corresponding to run lengths as shown in FIG. 5A. That is:
Run Length=2→Coefficient=3.0
Run Length=3→Coefficient=4.0
Run Length=4→Coefficient=5.0
Run Length=5→Coefficient=6.0 . . .

Based on the table storing coefficients corresponding to run lengths, the coefficient register 203 determines the coefficient corresponding to each run length and outputs the determined coefficient to the coefficient calculator 204. The coefficient defined in the run-length-corresponding coefficient table may be pre-stored as a register-set value. Alternatively, an optimum value may be externally input in accordance with a given system, and an update value may be defined as required.

FIG. 5B shows a data example input from the code data shift register 201 to the run length identifying portion 202. The shown example of code data includes bit streams in which the bit value, zero (0), has run lengths of 2, 3 and 4. For example, the coefficient 3.0 is selected for the bit stream of a run length of 2. The coefficient 4.0 is selected for the bit stream of a run length of 3. The coefficient 5.0 is selected for the bit stream of a run length of 4. The selected coefficient is output to the coefficient calculator 204.

The coefficient calculator 204 receives input of code data from the code data shift register 201 and further receives input of a coefficient selected from the table in accordance with the run length of each code bit included in the code data from the coefficient register 203.

The coefficient calculator 204 performs calculation based on the coefficient value corresponding to each run length of a component bit stream of the code data and outputs the calculation result to the adder 205. More specifically, the coefficient calculator 204 outputs to the adder 205 the coefficient value selected from the run-length-corresponding coefficient table for the bit stream, the NRZI conversion of the input code data bit of which results in one (1) as it is. On the other hand, for the bit stream, the NRZI conversion of the code data bit of which results in zero (0), the coefficient calculator 204 multiplies the coefficient value selected from the run-length-corresponding coefficient table for the bit stream by "−1" and outputs the multiplied value to the adder 205 as the DC level corresponding to the bit stream. This corresponds to the execution of the processing of outputting to the adder 205 a DC level value reflecting the signal amplitude in reading the code data.

Figure 6A:
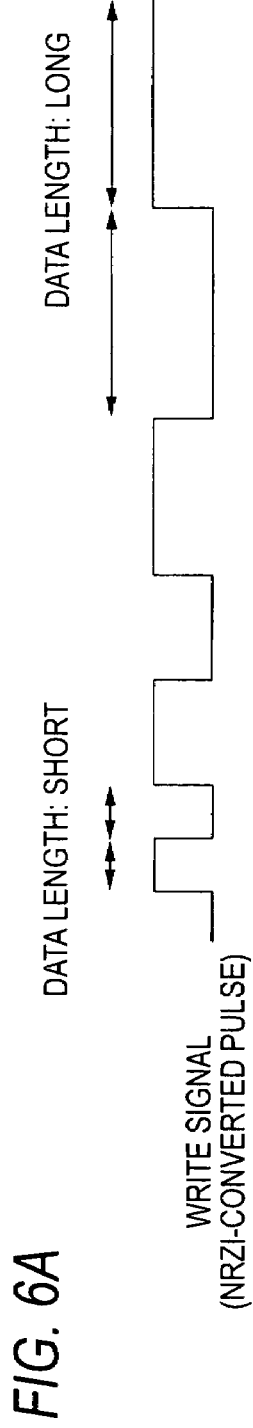
FIGS. 6A to 6C are diagrams describing coefficients defined in the run-length-corresponding coefficient table.
Figure 6B:
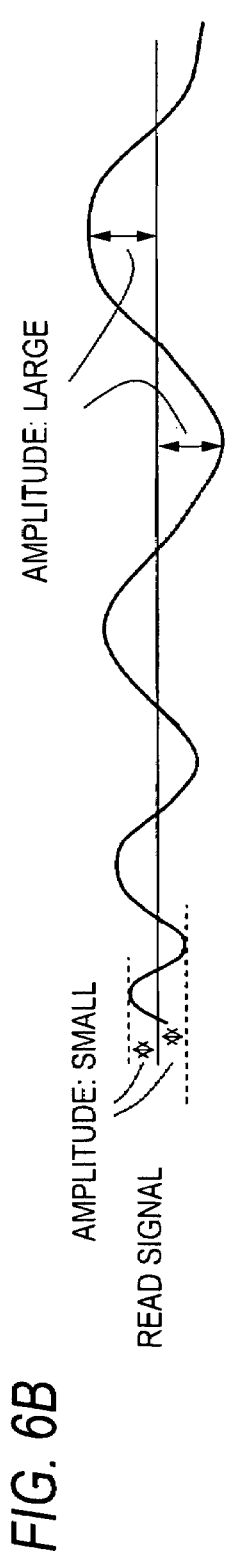
Figure 6C:
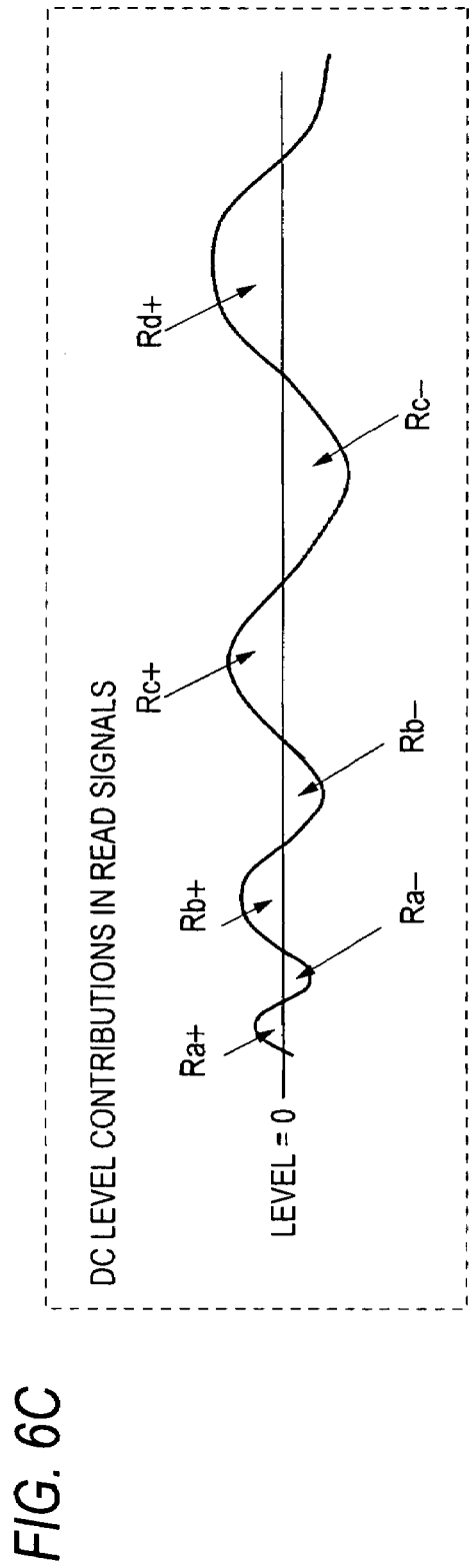

Referring to FIGS. 6A to 6C, the processing in the coefficient calculator 204, that is, the calculation of a DC level value reflecting the signal amplitude in reading code data will be described. In the description below, the length of an NRZI-converted pulse is a data length. That is, Data Length=Run Length+1. FIG. 6A shows an example of the NRZI-converted pulse created as a final write signal. FIG. 6B shows a signal in reading where the write signal is read by the pickup. The read signal tends to, as shown in FIG. 6B, have a small amplitude for a shorter data length of a write signal and a large amplitude for a longer data length of a write signal.

FIG. 6C is a diagram describing the DC level contributions in read signals. The DC level, that is, direct-current component in a read signal contributes to + above the line of DC level=0 and contributes to − below the line. Thus, the sum value of the areas of regions Ra to Rd enclosed by read signal waveforms and the level=0 is the sum value of final DC levels. Therefore, the areas of the regions Ra+, Rb+, Rc+ and Rd+ above the shown line at level=0 contribute to the addition of + values as DC levels while the areas of the regions Ra−, Rb− and Rc− below the shown line at level=0 contribute to the addition of − values as DC levels.

The area ratio between Ra and Rd is not equal to the ratio between data lengths of the NRZI-converted pulses in real read signals where Ra is the area of the region enclosed by the waveform of a read signal for the bit stream corresponding to the run length=2 of code data, which is a write signal, and the line at level=0, and Rd is the area of the region enclosed by the waveform of a read signal for the bit stream corresponding to the run length=5 and the line at level=0. In other words, the ratio of Run Length+1 is not achieved. Therefore, Ra:Rd=3:6 is not achieved.

In this case, Ra is a smaller area than (3/6) Rd.

For example, if the area ratio among Ra to Rd is equal to the ratio among data lengths of NRZI-converted pulses, that is, the ratio of run length +1, more specifically, Ra:Rb:Rc:Rd=3:4:5:6, is satisfied, where
  Ra: the area defined by a read signal corresponding to the bit stream of code data run length=2 and the line at DC level=0;
  Rb: the area defined by a read signal corresponding to the bit stream of code data run length=3 and the line at DC level=0;
  Rc: the area defined by a read signal corresponding to the bit stream of code data run length=4 and the line at DC level=0; and
  Rd: the area defined by a read signal corresponding to the bit stream of code data run length=5 and the line at DC level=0,
  the absolute value of the DSV is securely controlled to be close to zero by the adjustment processing using a DC control bit in the past, resulting in proper control of the low-frequency component, which causes no problem. In other words, no problem is caused by handling the symbols, one (1) and zero (0), corresponding to bit values of write bit streams (NRZI-converted signals) of code data as +1 point and −1 point, respectively, using the sum of symbols from the starting point of the waveform stream as a DSV and selecting and inserting the value of the DC control bit thereto such that the alienation of the DSV value from zero (0) can be small. However, as shown in FIGS. 6A to 6C,
  Ra:Rb:Rc:Rd=3:4:5:6 is not satisfied. In a general read signal,
  Ra is smaller than (3/6) Rd;
  Rb is smaller than (4/6) Rd; and
  Rc is smaller than (5/6) Rd.

Therefore, the DC level contribution of data contributing to the addition of − values in DC level is larger than the DC level contribution of data contributing to the addition of + values in DC level when write data having the waveform above the line at level=0 shown in FIG. 6C has a succession of write data at a high frequency (resulting in short run length) and write data having the waveform below the line at level=0 has a succession of write data at a low frequency (resulting in long run length) even by adopting the DSV control according to the method in the past, that is, by handling the symbols, one (1) and zero (0), corresponding to bit values of write bit streams (NRZI-converted signals) of code data as +1 point and −1 point, respectively, using a DSV as the sum of symbols from the starting point of the waveform stream and selecting and inserting the value of the DC control bit thereto such that the alienation of the DSV value from zero (0) can be small. As a result, the alienation of the DC level from zero (0) occurs, and proper control over low-frequency components may not be achieved disadvantageously.

The coefficient calculator 204 performs processing for solving the problem. That is, the coefficient calculator 204 performs processing of allowing the DSV indicated as a sum value at the DC level from the starting point of a waveform stream to be calculated as a value corresponding to the waveform of a real read signal in consideration of the DC level value reflecting the signal amplitude in reading code data.

The coefficient calculator 204 receives from the coefficient register 203 the input of a coefficient corresponding to the run length of each code bit included in code data input from the code data shift register 201, performs calculation thereon based on the coefficient value corresponding to each run length of a component bit stream of a code data and outputs the calculation result to the adder 205. For the bit the NRZI conversion of the input code data bit of which results in one (1), the coefficient calculator 204 outputs the coefficient value selected from the run-length-corresponding coefficient table for the bit to the adder 205 as it is. On the other hand, for the bit the NRZI conversion of the code data bit of which results in zero (0), the coefficient calculator 204 multiplies the coefficient value selected from the run-length-corresponding coefficient table for the bit by "−1" and outputs the multiplied value to the adder 205.

Referring to FIG. 7, a specific calculation processing example by the coefficient calculator 204 will be described. (1) in FIG. 7 shows code data input from the code data shift register 201. (2) shows an NRZI conversion result of the code data shown in (1). (3) shows registered coefficients corresponding to run length data input from the coefficient register 203 based on the run-length-corresponding coefficient table, which has been described with reference to FIG. 5.

The registered coefficient for a bit stream 301 of run length=2 is 3.0;
  the registered coefficient for a bit stream 302 of run length=3 is 4.0; and
  the registered coefficient for a bit stream 303 of run length=4 is 5.0.

(4) in FIG. 7 shows coefficient multiplication values defined based on the NRZI conversion results of the run length data 301 to 303.

Since the NRZI conversion result for the bit stream 301 of run length=2 is one (1), the coefficient multiplication value=+1;
  since the NRZI conversion result for the bit stream 302 of run length=3 is zero (0), the coefficient multiplication value=−1; and
  since the NRZI conversion result for the bit stream 303 of run length=4 is one (1), the coefficient multiplication value=+1.

(5) in FIG. 7 shows the output DC levels output from the coefficient calculator 204 to the adder 205.

The output DC level for the bit 301 of run length=2 is 3.0;
  the output DC level for the bit 302 of run length=3 is −4.0; and
  the output DC level for the bit 303 of run length=4 is 5.0.

The DSV corresponding to the waveform of a real read signal can be calculated by performing the DSV calculation based on the output DC level. The run-length-corresponding coefficient table described with reference to FIG. 5 has registered coefficients based on waveforms of real read signals. Referring to FIGS. 8A to 8C, the registered coefficients will be described.

FIG. 8A is a run-length-corresponding coefficient table, which is similar to the one described with reference to FIGS. 5A and 5B. The registered coefficients, which correspond to run lengths, are:

a for the bit stream 301 of run length=2 ,
b for the bit stream 302 of run length=3,
c for the bit stream 303 of run length=4, and
d for the bit stream 304 of run length=5.

The data shown in FIG. 8B is for describing the DC level contributions in read signals described with reference to FIG. 6C. The DC levels, that is, direct-current components, of the read signals contribute to + if above the line at the level=0 and − if below the line. In FIG. 8B, Ra: the area defined by lines of a read signal corresponding to the bit stream of code data run length=2 and the DC level=0;
Rb: the area defined by lines of a read signal corresponding to the bit stream of code data run length=3 and the DC level=0;
Rc: the area defined by lines of a read signal corresponding to the bit stream of code data run length=4 and the DC level=0; and
Rd: the area defined by lines of a read signal corresponding to the bit stream of code data run length=5 and the DC level=0.

As shown in FIG. 8C, the run-length-corresponding coefficient table shown in FIG. 8A defines the ratio of the coefficients:

$a:b:c:d \approx Ra/3:Rb/4:Rc/5:Rd/6$

In other words, the coefficient calculator 204 performs processing of calculating the DC level corresponding to each run length bit stream by applying the coefficient in consideration of the contribution of the DC level calculated based on the waveform of a real read signal and outputting the calculated DC level to the adder 205. The method in the past handles all of these coefficients, a to d, as one (1). In other words, the method in the past adopts the present method under condition that $Ra:Rb:Rc:Rd \approx 3:4:5:6$ is satisfied.

The adder 205 performs processing of adding the DC level value input from the coefficient calculator 204 and the DC level sum value up to this point. In other words, the adder 205 adds the DC level sum value calculated based on input waveforms up to this point from the DC level addition result register 206 and the DC level value input from the coefficient calculator 204 and outputs the sum value to the DC level addition result register 206.

Every time the DC level sum value is input from the adder 205, the DC level addition result register 206 holds the input DC level sum value in the register and feedbacks the addition result to the adder 205 and outputs the addition result to the DC control bit inserting portion 103 as an output from the DC level calculating portion 102.

For every data at predetermined DC control bit insertion intervals, the DC control bit inserting portion 103 refers to the DC level sum value input by the DC level calculating portion 102, determines the value of the DC control bit to be inserted such that the absolute value of the total of the DC level sum values from the start of modulation can be close to zero (0), and inserts a proper DC control bit having the determined value to the code data stream input from the modulating portion 101 at each DC control bit insertion data intervals. The DC control code data stream having the DC control bit is output to the NRZI converting portion 104. The NRZI converting portion 104 converts the DC-controlled code data stream to NRZI signals, and the converted data is recorded on the disk 106 through the pickup 105 as write data.

In this way, since the processing of calculating a DC level is performed by applying the coefficient in consideration of the DC level contribution corresponding the waveform of a read signal according to the embodiment of the invention, the precise DC level control corresponding to the real read signal can be achieved, which increases the effect of reducing the low-frequency component. Therefore, for example, the influence on the instability of the servo with an increase in low-frequency component of a read signal can be reduced. As a result, the power consumption can be reduced as well as good read signals can be obtained without requiring the reinforcement of the control for maintaining the stability of the servo.

Having described the processing example for the digital modulation processing unit shown in FIG. 1, which performs the modulation processing of inserting a DC control bit at predetermined DC control intervals to a modulated code data stream as in (1,7) RLL, for example, the processing according to the embodiment of the invention, that is, the processing to be performed by applying the coefficient in consideration of the DC level contribution corresponding to the waveform of a read signal is applicable to digital modulation processing units having other constructions.

Figure 9:
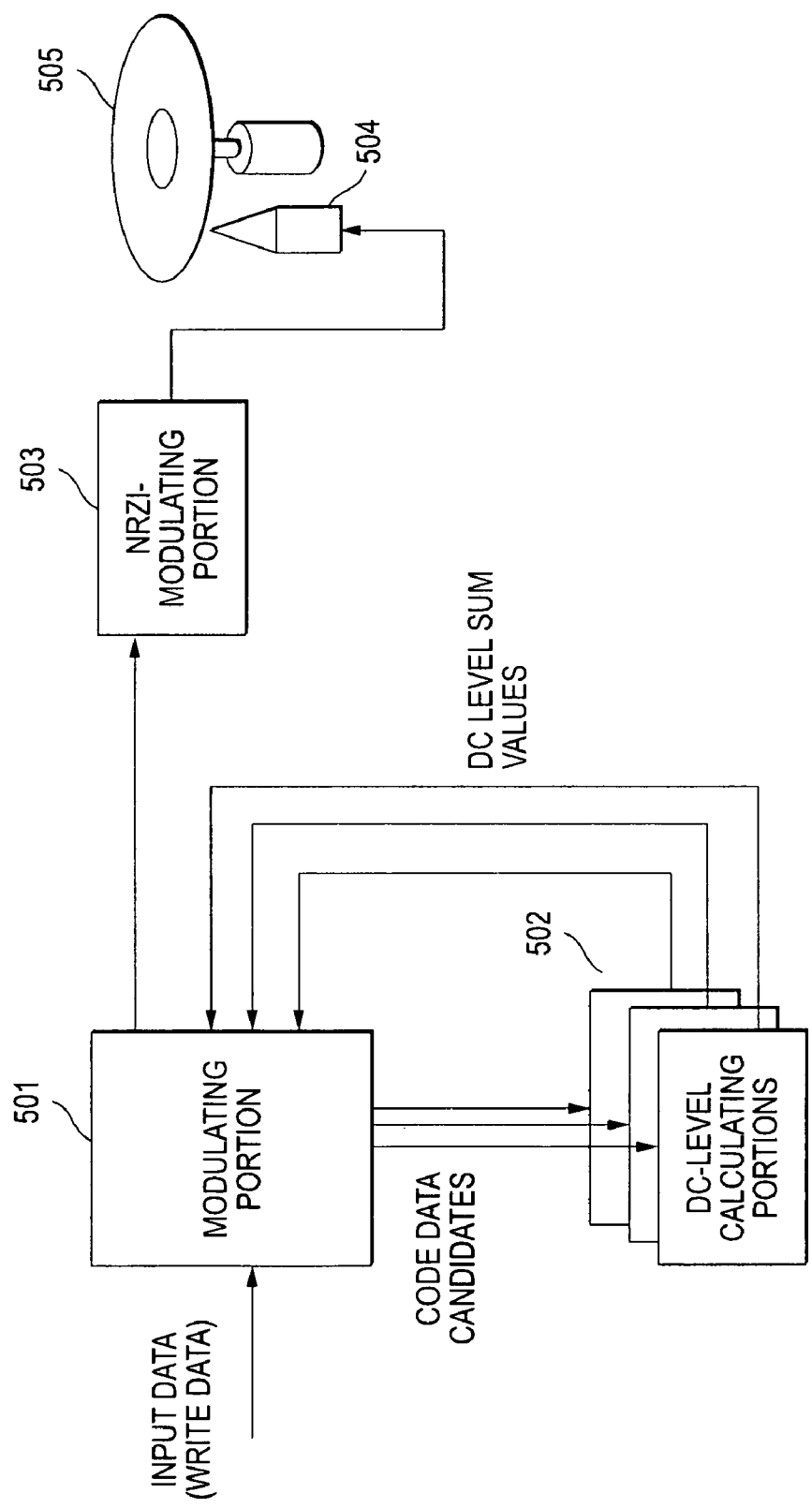
FIG. 9 is a diagram showing another example construction of the digital modulation processing unit of the information recording processing apparatus according to the embodiment of the invention.

For example, FIG. 9 shows a construction example of a digital modulation processing unit, which determines code data with reference to a DC level sum value for each one word of input data as in 8-16 modulation.

In order to perform 8-16 modulation, for example, in the digital modulation processing unit shown in FIG. 9, a modulating portion 501 converts input data of 8-bit words to 16-bit code data in accordance with a conversion table. In this case, the modulating portion 501 refers to the DC level sum value based on data, which has been already processed, and selects multiple code data candidates for which the absolute value of the total of the DC level sum values from the start of the modulation can be close to zero (0) from multiple prepared code data candidates. The modulating portion 501 outputs the selected one or more code data candidates to a DC level calculating portion 502.

The DC level calculating portion 502 has multiple DC level calculating potions, the number of which corresponds to the number of code data candidates input from the modulating portion 501 and which can perform parallel calculation. Each of these DC level calculating portions has the same construction as the one described above with reference to FIG. 4 and determines the run length of a bit stream included in code data of each of the code data candidates and obtains the coefficient corresponding to the run length with reference to a run-length-corresponding coefficient table, which is similar to the one described with reference to FIG. 5A.

Each of the DC level calculating portions 502 further determines the output DC level through the multiplication by the coefficient multiplication value, which is calculated in accordance with the NRZI conversion result described with reference to FIGS. 7A to 7E, calculates the result of the addition between the determined DC level and the DSV value based on code data in the past and outputs the calculated DC level sum value for each code data candidate to the modulating portion 501.

The modulating portion 501 selects the one having the absolute value closest to zero (0) from the multiple DC level sum values corresponding to the multiple code data candidates and outputs it to a NRZI converting portion 503 as the final output code data. The NRZI converting portion 503 converts the code data stream input from the modulating portion 501 to an NRZI signal, outputs it as a write data stream and records the write data stream on a disk.

Also in this construction, since the DC level calculation processing is performed by applying the coefficient in consideration of the DC level contribution corresponding to the waveform of a read signal, the precise DC level control corresponding to the real read signal can be achieved, which increases the effect of reducing the low-frequency component. Thus, the influence on the instability of the servo due to the increase in low-frequency component of a read signal can be reduced, for example. Therefore, the power consumption can be reduced and a good read signal can be obtained without requiring the reinforcement of control for maintaining the stability of the servo.

Figure 10:
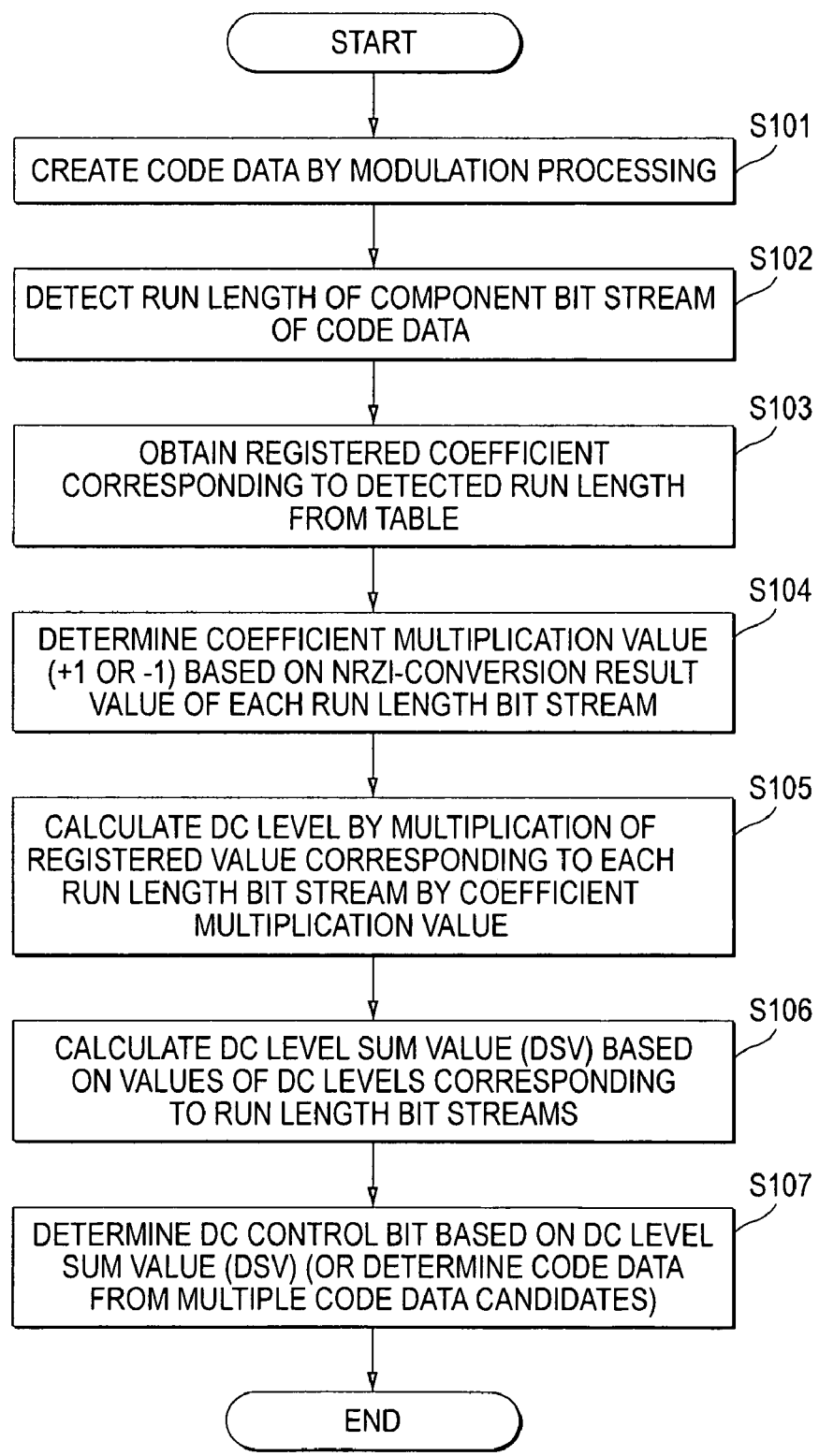
FIG. 10 is a flowchart describing a processing sequence of the information recording processing apparatus according to the embodiment of the invention.

Next, modulation processing and DC level control sequences in the information recording processing according to the embodiments of the invention will be described with reference to FIG. 10. In step S101, modulation processing corresponding to write data is performed, and code data is created thereby. Notably, the digital modulation processing unit having the construction in FIG. 1, for example, performs modulation processing in accordance with (1,7) RLL modulation while the one having the construction described with reference to FIG. 9 creates multiple code data candidates under 8-16 modulation, for example.

Next, in step S102, the run lengths of component bit streams of the code data (or code data candidate) are detected. In step S103, the coefficients corresponding to the detected run lengths are obtained from a run-length-corresponding coefficient table. For example, the run-length-corresponding coefficient table described with reference to FIG. 5 may be used. The coefficients on the table reflect the ratio of areas of the regions enclosed by read signal waveforms and the line at level zero (0), as described with reference to FIGS. 6A to 6C.

Next, in step S104, the coefficient multiplication value (+1 or −1) is determined based on the NRZI conversion result of each of the run length bit stream. It should be noted that the determination here may be based on the NRZI pulse stream estimated based on the code data stream without requiring actually performing the NRZI conversion processing.

Next in step S105, the DC level corresponding to each of the run length bit streams is calculated by multiplying the registered coefficient corresponding to each of the run length bit streams by the coefficient multiplication value. This processing is the one described above with reference to FIGS. 7A to 7E.

Next in step S106, the DC level calculated in step S105 and the DC level sum value (DSV) based on the calculated code data stream are added, whereby the new DSV value for update is calculated.

Next in step S107, a DC control bit is determined based on the DC level sum value (DSV). Alternatively, the final code data may be determined from multiple code data candidates.

In the construction described with reference to FIG. 1, the DC control bit inserting portion determines the DC control bit for bringing the DSV closer to zero (0) and performs the insertion of the DC control bit. On the other hand, in the construction described with reference to FIG. 9, the modulating portion 501 selects one the absolute value of which is closer to zero (0) from multiple DC level sum values corresponding to multiple code data candidates and handles it as the final output code data.

The code data created and DC-controlled in this way is output to the NRZI converting portion, is converted to NRZI signals in the NRZI converting portion and is recorded on a disk as write data.

Having described details of the invention with reference to the specific embodiment, it is self-evident that those skilled in the art can modify and/or substitute the embodiment without departing from the substance of the invention. In other words, the invention has been disclosed for illustrative purpose only, and it should not be interpreted limitedly. The substance of the invention should be determined in consideration of the appended claims.

The series of processing described herein may be executed by hardware, software or a combined construction of both. The execution of the processing by software may be achieved by installing and executing a program recording the processing sequences in a memory within a computer built in specific hardware or by installing and executing the program in a generic computer in which various processing is executable.

For example, the program may be recorded in a hard disk or a Read-Only Memory (ROM) as recording media in advance. Alternatively, the program may be temporarily or permanently stored (or recorded) in a removable recording medium such as a flexible disk, a Compact Disc Read-Only Memory (CD-ROM), a Magneto optical (MO) disk, a Digital Versatile Disc (DVD), a magnetic disk and a semiconductor memory. Such a removable recording medium can be provided as so-called package software.

In addition to the install from a removable recording medium as described above to a computer, the program may be transferred from a download site to a computer in a wireless manner or may be transferred to a computer over a network such as a Local Area Network (LAN) and the Internet in a wired manner. The computer may receive the program transferred in this way and install it in a recording medium such as a self-contained hard disk.

The processing described herein may be not only executed in the time-series manner as described herein but also may be executed in parallel or separately in accordance with the processing ability of an apparatus, which executes the processing, or as required. The system herein is a logical set construction of multiple devices, and the component devices are not always accommodated in one cabinet.

As described above, in the construction according to an embodiment of the invention, when DC level control is performed based on the DSV of modulated data created based on write data on a recording medium, the processing of calculating the DC level is performed by applying a coefficient in consideration of the DC level contribution corresponding to the waveform of a read signal. The construction allows the precise DC level control corresponding to a real read signal, which increases the effect of reducing the low-frequency component. Thus, the influence on the instability of the servo due to the increase in low-frequency component of a read signal can be reduced, for example. Therefore, the power consumption can be reduced, and a good read signal can be obtained without requiring the reinforcement of control for maintaining the stability of the servo.

The invention claimed is:

1. An information recording processing apparatus, comprising:
    a modulating portion operable to modulate write data on an information recording medium and to create code data thereby; and a DC level calculating portion operable to calculate a DC level corresponding to a given run length based on a coefficient defined in accordance with the run length of a component bit of the code data, wherein DC-controlled code data is created or selected based on a DC level addition result based on the DC level corresponding to the given run length, and the created or selected data is defined as write data onto the information recording medium.

2. The information recording processing apparatus according to claim 1, further comprising:

a DC control bit inserting portion operable to define a DC control bit by applying a digital sum value (DSV) based on the DC level addition result; and an NRZI converting portion operable to perform an NRZI conversion process on data after the DC control bit is inserted thereto by the DC control bit inserting portion.

3. The information recording processing apparatus according to claim 2, wherein:

the DC level calculating portion performs a process of calculating, as the DC level corresponding to each run length bit, the result of the multiplication of the coefficient corresponding to the run length in consideration of the DC level contribution corresponding to the waveform of a read signal from an information recording medium by the coefficient multiplication value determined by the NRZI-converted value of each run-length-corresponding bit.

4. The information recording processing apparatus according to claim 3, wherein:

the DC level calculating portion determines the coefficient multiplication value as:

1 when the NRZI-converted value of each run-length-corresponding bit is 1; and

−1 when the NRZI-converted value of each run-length-corresponding bit is 0.

5. The information recording processing apparatus according to claim 1, wherein:

the modulating portion selects multiple code data candidates through write data modulation processing;

the DC level calculating portion performs the process of calculating the DC level corresponding to the run length based on the coefficient defined in accordance with the run length of a component bit of each code data candidate of the multiple code data candidates; and the modulating portion performs a final code data determination process by applying a digital sum value (DSV) based on the DC level addition result based on the DC levels corresponding to the multiple run lengths for each of the code data candidates.

6. The information recording processing apparatus according to claim 1, wherein the coefficient defined in accordance with the run length of a component bit of code data to be applied by the DC level calculating portion is a coefficient reflecting the ratio of the areas of the regions defined by read signals corresponding to a bit stream and the line at DC level=0.

7. An information recording processing method, comprising:

modulating write data on an information recording medium and creating code data thereby;

calculating a DC level corresponding to a given run length based on a coefficient defined in accordance with the run length of a component bit of the code data; and creating or selecting DC-controlled code data based on a DC level addition result based on the DC level corresponding to the given run length, and defining the created or selected data as write data onto the information recording medium.

8. The information recording processing method according to claim 7, further comprising:

performing a process to define a DC control bit by applying a digital sum value (DSV) based on the DC level addition result; and performing an NRZI conversion process on data after the DC control bit is inserted thereto.

9. The information recording processing method according to claim 8, wherein:

the DC level calculating step includes calculating, as the DC level corresponding to each run length bit, the result of the multiplication of the coefficient corresponding to the run length in consideration of the DC level contribution corresponding to the waveform of a read signal from an information recording medium by the coefficient multiplication value determined by the NRZI-converted value of each run-length-corresponding bit.

10. The information recording processing method according to claim 9, wherein:

the DC level calculating step includes determining the coefficient multiplication value as:

1 when the NRZI-converted value of each run-length-corresponding bit is 1; and

−1 when the NRZI-converted value of each run-length-corresponding bit is 0.

11. The information recording processing method according to claim 7, wherein:

the modulating step includes selecting multiple code data candidates through write data modulation processing; and the DC level calculating step includes performing the process of calculating the DC level corresponding to the run length based on the coefficient defined in accordance with the run length of a component bit of each code data candidate of the multiple code data candidates;

the method further comprising performing a final code data determination process by applying a digital sum value (DSV) based on the DC level addition result based on the DC levels corresponding to the multiple run lengths for each of the code data candidates.

12. The information recording processing method according to claim 7, wherein the coefficient defined in accordance with the run length of a component bit of code data to be applied by the DC level calculating step is a coefficient reflecting the ratio of the areas of the regions defined by read signals corresponding to a bit stream and the line at DC level=0.

13. A computer program for causing an information recording processing apparatus to perform a process of creating write data, the program comprising:

modulating write data on an information recording medium and creating code data thereby;

calculating a DC level corresponding to a given run length based on a coefficient defined in accordance with the run length of a component bit of the code data; and creating or selecting DC-controlled code data based on a DC level addition result based on the DC level corresponding to the given run length, and defining the created or selected data as write data onto the information recording medium.

* * * * *